United States Patent [19]

Osawa et al.

[11] Patent Number: 4,587,495
[45] Date of Patent: May 6, 1986

[54] CASCODE AMPLIFIER WITH AN IMPROVED BIASING ARRANGEMENT

[75] Inventors: Michitaka Osawa; Kunio Ando; Hitoshi Maekawa, all of Yokohama, Japan

[73] Assignee: Hitachi, Ltd., Tokyo, Japan

[21] Appl. No.: 496,257

[22] Filed: May 19, 1983

[30] Foreign Application Priority Data

May 21, 1982 [JP] Japan ................................. 57-84704

[51] Int. Cl.[4] ........................... H03F 3/68; H03F 3/16
[52] U.S. Cl. ..................................... 330/311; 330/300; 330/296
[58] Field of Search ............... 330/296, 300, 310, 311; 315/403, 405

[56] References Cited

U.S. PATENT DOCUMENTS 3,462,701  8/1969  Miller .............................. 330/296 X
3,546,614 12/1970  Lochstampfer ................. 330/294 X
4,203,131  5/1980  Harwood et al. ..................... 358/34

FOREIGN PATENT DOCUMENTS 1143619  2/1969  United Kingdom ............... 330/311

Primary Examiner—Eugene R. LaRoche
Assistant Examiner—Steven J. Mottola
Attorney, Agent, or Firm—Antonelli, Terry & Wands

[57] ABSTRACT

A cascode amplifier comprises a grounded-emitter drive transistor which has a collector supplied with a bias current from a bias current source and operates in response to an input signal and a grounded-base (or grounded-gate) output transistor which has a collector supplied with a bias current from a constant voltage source, wherein the collector of the drive transistor is connected to the emitter (or source) of the output transistor. A constant current circuit is connected to the junction between the collector of the drive transistor and the emitter (or source) of the output transistor for supplying a part of the bias current applied to the drive transistor to thereby decrease the bias current of the output transistor while causing the drive transistor to be operated in the linear region. The cascode amplifier is thus imparted with a broad band frequency characteristic.

5 Claims, 3 Drawing Figures

CASCODE AMPLIFIER WITH AN IMPROVED BIASING ARRANGEMENT

BACKGROUND OF THE INVENTION

The present invention relates to a cascode amplifier composed of a grounded-gate FET or a grounded-base transistor and a grounded-emitter transistor.

An example of the cascode amplifier applied to the final stage of a driver circuit for a color picture tube is disclosed in U.S. Pat. No. 4,203,131. The driver circuit for the picture tube is required to exhibit a wide band frequency characteristic.

In an output transistor, an improved high frequency characteristic is usually accompanied with a correspondingly lowered voltage withstanding capability and decreased collector loss. Accordingly, in the cascode amplifier for which a wide band frequency characteristic is required, the operating voltage has to be set at a low level within a range which brings about no trouble in driving the picture tube. To this end, a bias current which flows through a load resistor of the grounded-base or grounded-gate transistor and corresponds to the black level displayed on the picture tube must be set as small as possible. On the other hand, since the current flowing through the load resistor is substantially equal to the collector current of the grounded-emitter transistor, the biasing point is set in a non-linear rise-up region of a base-emitter voltage ($V_{BE}$)-collector current ($I_C$) characteristic curve for the grounded-emitter transistor, when the bias current is set at a small value. As the consequence, when the bias current is to be decreased, the output signal of the cascode amplifier will directly undergo the influence of non-linear distortion of the $V_{BE}$-$I_C$ characteristic. Further, because the cut-off frequency of the grounded-emitter transistor becomes higher as the collector current thereof increases, the setting of the bias current at a small value will lower the cut-off frequency, providing an obstacle in realizing a cascode amplifier of a broad bandwidth.

SUMMARY OF THE INVENTION

It is an object of the present invention to eliminate the shortcomings of the prior art cascode amplifier described above and provide a cascode amplifier which enjoys a broad band frequency characteristic.

In view of the above object, there is proposed according to a feature of the present invention a cascode amplifier in which a constant current source is provided for the grounded-emitter (or grounded-source) transistor to supply a major part of the collector (or drain) bias current to this transistor, to thereby allow the latter to operate in a broad frequency band without increasing the bias current for the grounded-base (or grounded-gate) transistor.

DESCRIPTION OF THE PREFERRED EMBODIMENTS

Figure 1:
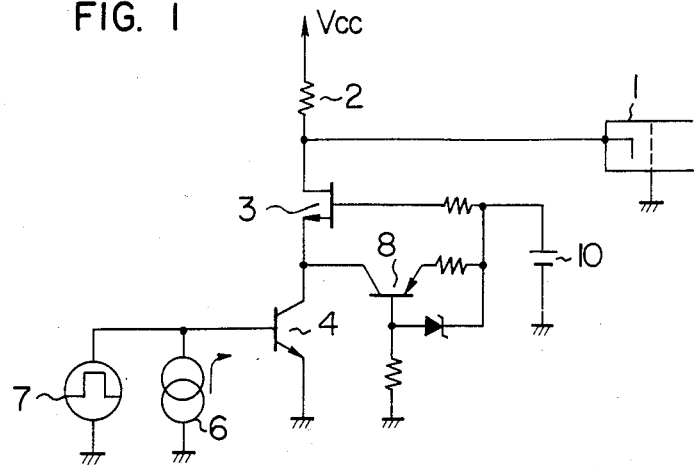
FIG. 1 is a schematic circuit diagram of a cascode amplifier according to an embodiment of the invention.

Referring to FIG. 1 which shows a cascode amplifier according to an exemplary embodiment of the invention, reference numeral 1 denotes a picture tube having a first grid connected to the ground and a cathode electrode to which a driving signal is applied, reference numeral 3 denotes a load resistor, reference numeral 3 denotes a MOS FET adapted to operate with the gate being connected to the ground (i.e. grounded-gate MOS FET), reference numeral 4 denotes a NPN transistor operative with the emitter being grounded, reference numeral 6 denotes a bias current source for supplying a base bias current to the transistor 4, reference numeral 7 denotes a signal source, reference numeral 8 denotes a transistor adapted to operate as a constant current source, and reference numeral 10 denotes a power source.

Figure 2:
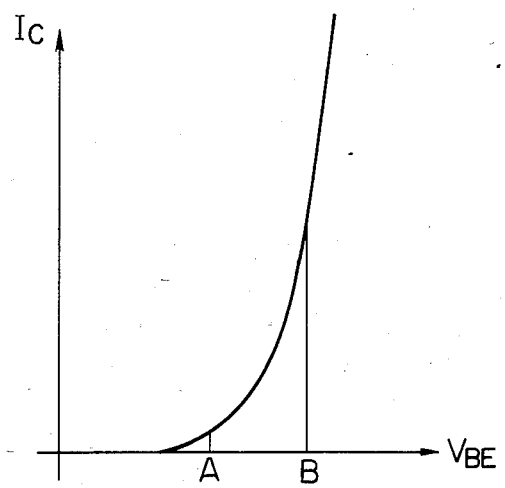
FIG. 2 graphically illustrates voltage current ($V_{BE}$-$I_C$) characteristic of a transistor.

In order that the output signal of the cascode amplifier be insusceptible to the influence of non-linear distortion in the rise-up portion of a voltage current ($V_{BE}$-$I_C$) characteristic curve shown in FIG. 2, the biasing point should be shifted from a point A to a point B which corresponds to a higher base-emitter voltage $V_{BE}$, that is, the bias point is shifted within a substantially linear region of the $V_{BE}$-$I_C$ characteristic curve. This can be accomplished by connecting the collector of the transistor 8 which serves as a current source to a junction between the source electrode of FET 3 and the collector of the transistor 4 so that a major part of the collector current of the transistor 4 is supplied by the transistor 8. In this conjunction, it goes without saying that the base bias current of the transistor 4 supplied from the current source 6 is set at such a value that the increased collector current can be generated. Since the transistor 8 exhibits a high output impedance, the connection of the transistor 8 brings about essentially no influence to the signal components.

Figure 3:
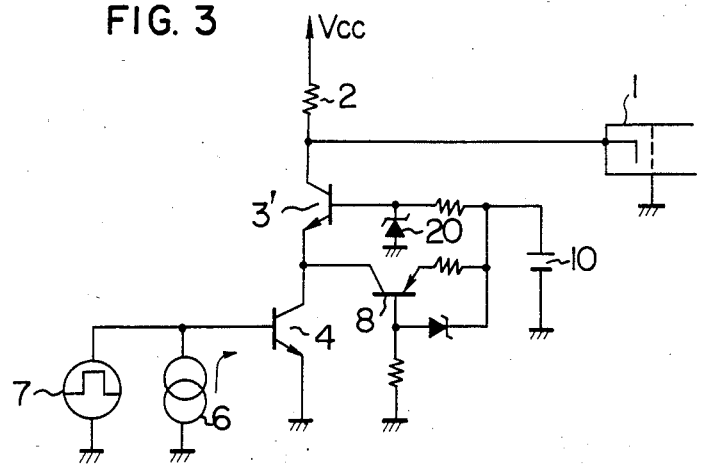
FIG. 3 is a schematic circuit diagram of a cascode amplifier according to another embodiment of the invention.

FIG. 3 shows a cascode amplifier according to another embodiment of the invention which differs from the one shown in FIG. 1 in respect that the MOS FET 3 is replaced by an NPN transistor 3'. When the bipolar transistor 3' is employed, the collector potential of the transistor 8 takes a value which is lower than the base potential of the transistor 3' by the base-emitter voltage $V_{BE}$. Accordingly, in order to assure the collector-emitter voltage which is required for the transistor 8 to operate as the constant current source, a Zener diode 20 is provided for lowering the base potential of the transistor 3'.

In the cascode amplifiers according to the present invention, the bias currents for the MOS FET 3 (or NPN transistor 3') and the transistor 4 can be set independent of each other, as the result of which the operating point of the transistor 4 can be shifted to the substantially linear region of the $V_{BE}$-$I_C$ characteristic curve shown in FIG. 2 without involving any appreciable increase in the bias current of the FET 3 or NPN transistor 3'.

Further, the collector current of the transistor 4 is increased by the current supplied from the constant current circuit, as described above. Accordingly, the amplifier can be operated in a region where the cut-off frequency $f_T$ is high.

In the present state of the art, a power MOS FET having a sufficiently high transconductance $G_m$ to replace the transistor 4 is not yet available for practical applications. It is however obvious that the invention can be applied to the circuit where the NPN transistor 4 is replaced by a grounded-source MOS FET having gate-source voltage ($V_{GS}$)-drain current ($I_D$) characteristic similar to the one shown in FIG. 2.

I claim:

1. A cascode amplifier for driving a cathode ray tube comprising:
   a common-gate FET having a drain electrode connected to an electrode of said cathode ray tube and to a first DC voltage source through a load impedance, a gate electrode connected to a second DC voltage source, and a source electrode;
   a common-emitter transistor having a base electrode connected to a video signal source, an emitter electrode connected to a common potential, and a collector electrode connected to said source electrode of said FET, the frequency characteristics of said common-emitter transistor being widened in accordance with an increase of a collector current passing therethrough; and
   a constant current source connected in parallel to the collector-emitter path of said common emitter transistor for providing an additional collector current through said common-emitter transistor,
   wherein said constant current source comprises another transistor having a collector electrode connected to said collector electrode of said common-emitter transistor, an emitter electrode connected to said second DC voltage source, and a base electrode connected to said common potential.

2. A cascode amplifier for a picture tube, comprising:
   a first transistor having a first main electrode adapted for connection to a cathode of said picture tube, a grounded control electrode and a second main electrode;
   a second transistor of bipolar type having a third main electrode connected to said second main electrode, a fourth main electrode grounded and a base adapted for connection to a video signal source, said second transistor having a collector current versus base-emitter voltage characteristic comprising a non-linear region for a base-emitter voltage below a predetermined voltage and a substantially linear region for a base-emitter voltage above said predetermined voltage, said second transistor, when operated in the non-linear region, having inferior high frequency characteristics to that of said first transistor and, when operated in said linear region, having a better frequency characteristic than that in which occurs when operated in said non-linear region;
   first bias shifting means, coupled to said second transistor, for shifting an operating point of said second transistor from said non-linear region to said linear region, said first bias shifting means including a constant current source connected to said third electrode for applying a constant current of a predetermined amplitude to said third electrode and bias current supplying means connected to said base for applying a base bias current to said base to produce said constant current in said second transistor through said third and fourth electrodes;
   wherein said predetermined amplitude of said constant current is so set that, when a minimum expected current flows from said first transistor into said second transistor, said minimum current added to said constant current has an amplitude which operates said second transistor within said linear region, and further
   wherein said constant current source comprises a third transistor having a collector connected to the third electrode of said second transistor, a predetermined bias being applied between a base and emitter of said third transistor.

3. A cascode amplifier according to claim 2, wherein said first transistor comprises a bipolar transistor, and further including second bias shifting means for shifting the base bias voltage of said first transistor in the direction in which the collector-emitter voltage of said third transistor is increased.

4. A cascode amplifier according to claim 3, wherein said second bias shifting means includes a voltage source, said bias current supplying means being powered by said voltage source.

5. A cascode amplifier according to claim 2, wherein said first transistor comprises a field effect transistor.

* * * * *